(12) United States Patent  
Li et al.

(10) Patent No.: US 12,310,059 B2  
(45) Date of Patent: May 20, 2025

(54) SEMICONDUCTOR DEVICE AND ELECTRONIC DEVICE

(71) Applicant: WUHAN CHINA STAR OPTOELECTRONICS TECHNOLOGY CO., LTD., Hubei (CN)

(72) Inventors: Zhifu Li, Hubei (CN); Guanghui Liu, Hubei (CN); Fei Ai, Hubei (CN); Dewei Song, Hubei (CN)

(73) Assignee: WUHAN CHINA STAR OPTPELECTRONICS TECHNOLOGY CO., LTD., Wuhan (CN)

( * ) Notice: Subject to any disclaimer, the term of this patent is extended or adjusted under 35 U.S.C. 154(b) by 342 days.

(21) Appl. No.: 18/050,725

(22) Filed: Oct. 28, 2022

(65) Prior Publication Data

US 2024/0038895 A1  Feb. 1, 2024

(30) Foreign Application Priority Data

Jul. 27, 2022 (CN) .......................... 202210892203.0

(51) Int. Cl.
*H01L 29/786* (2006.01)
*H10D 30/67* (2025.01)
*H10D 62/17* (2025.01)

(52) U.S. Cl.
CPC ..... *H10D 30/6731* (2025.01); *H10D 30/6729* (2025.01); *H10D 30/6745* (2025.01); *H10D 30/6757* (2025.01); *H10D 62/235* (2025.01)

(58) Field of Classification Search
CPC ........... H01L 29/78675; H01L 29/1033; H01L 29/41733; H01L 29/78696; H01L 29/78642; H01L 29/78672
See application file for complete search history.

(56) References Cited

U.S. PATENT DOCUMENTS

2013/0056742 A1* 3/2013 Tezuka .............. H01L 21/02595  
  438/479  
2021/0305284 A1* 9/2021 He .................... H01L 29/66757

* cited by examiner

*Primary Examiner* — Mohammed R Alam  
(74) *Attorney, Agent, or Firm* — PV IP PC; Wei Te Chung

(57) ABSTRACT

A semiconductor device and an electronic device are provided. The semiconductor device includes an insulating substrate, and a non-planar layer disposed on the insulating substrate and including a non-planar structure. The non-planar structure includes a sidewall. An active pattern is configured with at least a part located on the sidewall of the non-planar structure. The active pattern includes a channel located on the sidewall. A ratio of a size of the non-planar structure in a thickness direction of the non-planar layer to a thickness of the active pattern is less than or equal to seven.

20 Claims, 7 Drawing Sheets

SEMICONDUCTOR DEVICE AND ELECTRONIC DEVICE

CROSS REFERENCE TO RELATED APPLICATIONS

This application claims priority to China Patent Application No. 202210892203.0, filed Jul. 27, 2022, and the disclosure of which is incorporated herein by reference in its entirety.

BACKGROUND OF INVENTION

1. Field of Invention

The present application relates to a technical field of displays, and particularly to a semiconductor device and an electronic device.

2. Related Art

Integrating integrated circuits (ICs) on glass substrates (system on glass, SOG) can greatly improve integration of display panels and reduce manufacturing cost of the display panels. However, achievement of the integration of integrated circuits on glass substrates requires improvement in mobility of conventional thin-film transistors.

Therefore, how to improve the mobility of thin-film transistors is a technical problem that needs to be solved.

SUMMARY OF INVENTION

An object of the present application is to provide a semiconductor device and an electronic device to provide conditions for improving mobility of the semiconductor device.

In order to achieve the above-mentioned object, the present application provides a technical solution as follows:

A semiconductor device, including an insulating substrate, a non-planar layer disposed on the insulating substrate and including a non-planar structure, and the non-planar structure includes a sidewall, an active pattern of which at least part is located on the sidewall of the non-planar structure, and the active pattern includes a channel located on the sidewall. Specifically, a ratio of a size of the non-planar structure in a thickness direction of the non-planar layer to a thickness of the active pattern is less than or equal to seven.

In the semiconductor device of some embodiments, the ratio of the size of the non-planar structure in the thickness direction of the non-planar layer to the thickness of the active pattern is greater than or equal to two.

In the semiconductor device of some embodiments, the thickness of the active pattern is greater than or equal to 350 angstroms and less than or equal to 600 angstroms.

In the semiconductor device of some embodiments, the sidewall is arranged at a slope angle greater than or equal to 45 degrees and less than or equal to 90 degrees with respect to the insulating substrate.

In the semiconductor device of some embodiments, the channel is at least part of a single crystallite.

In the semiconductor device of some embodiments, a size of the single crystallite is greater than or equal to 0.25 microns.

In the semiconductor device of some embodiments, the channel includes a plurality of crystallites.

In the semiconductor device of some embodiments, the active pattern includes a plurality of crystallites.

In the semiconductor device of some embodiments, the active pattern is a low-temperature polysilicon active pattern.

In the semiconductor device of some embodiments, the semiconductor device includes a gate located on a side of the active pattern away from the sidewall, and an orthographic projection of the gate on the insulating substrate overlaps an orthographic projection of the channel on the insulating substrate.

In the semiconductor device of some embodiments, the semiconductor device further includes a gate insulating layer disposed between the gate and the active pattern, and the gate insulating layer includes an inclined portion, the inclined portion covers a part of the active pattern on the sidewall, and the gate includes a gate sidewall located on the inclined portion. The gate sidewall is disposed at a slope angle greater than or equal to 30 degrees and less than or equal to 60 degrees with respect to the inclined portion.

In the semiconductor device of some embodiments, the active pattern further includes a first contact portion and a second contact portion that are connected to opposite sides of the channel.

The semiconductor device further includes an interlayer dielectric layer located on a side of the gate insulating layer away from the insulating substrate and covering the gate and the gate insulating layer, a first contact hole extending through the interlayer dielectric layer and the gate insulating layer and arranged corresponding to the first contact portion, a second contact hole extending through the interlayer dielectric layer and the gate insulating layer and arranged corresponding to the second contact portion, a source electrode disposed in contact with the first contact portion through the first contact hole, and a drain electrode disposed in contact with the second contact portion through the second contact hole.

In the semiconductor device of some embodiments, the sidewall includes an insulating sidewall in contact with the channel.

In the semiconductor device of some embodiments, the non-planar structure includes a convex structure or a groove structure, and the sidewall is a sidewall included in the convex structure or a sidewall included in the groove structure.

The present application further provides an electronic device, including the above-mentioned semiconductor device.

The present application has advantageous effects as follows: the present application provides a semiconductor device. By setting the ratio of the size of the non-planar structure of the non-planar layer in a thickness direction of the non-planar layer to a thickness of the active pattern to be less than or equal to seven, the size of the non-planar structure in the thickness direction of the non-planar layer is relatively small, making the sidewall of the non-planar structure also relatively small in size, so that the length of the channel of the active pattern on the sidewall of the non-planar structure is relatively small as well. In addition, during crystallization to form the active pattern, it is easier to form the seed crystal at corners adjacent to the sidewall of the non-planar structure. When the seed crystal grows along the sidewall to form the single crystallite, the length of the channel on the sidewall is relatively small, which provides formation conditions for the channel on the sidewall to be composed of the single crystallite. There is no grain boundary in a single crystallite, thereby providing formation conditions for a semiconductor device including a single crystallite channel and having high mobility, thus providing conditions for integrated circuits to be integrated on the insulating substrate.

DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in the present application, all other embodiments obtained by those skilled in the art without creative work fall within the protection scope of the present application.

Figure 1:
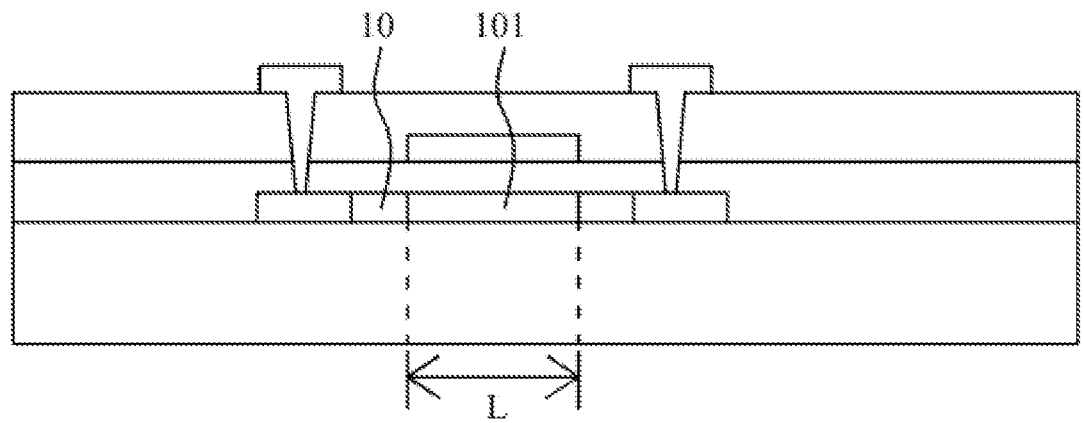
FIG. 1 is a schematic view of a conventional thin-film transistor array substrate.

Please refer to FIG. 1, which is a schematic view of a conventional thin-film transistor array substrate. As shown in FIG. 1, an active layer 10 of a conventional thin-film transistor is located on a plane. Due to limitations of exposure accuracy and etching accuracy in a display panel manufacturing process, a length L of a channel 101 of the active layer 10 is often greater than 2 microns. The channel 101 with a length greater than 2 microns has more grain boundaries, resulting in lower mobility of thin-film transistors.

In view of the problems in conventional technologies, the present application provides a semiconductor device. By setting a ratio of a size of a non-planar structure of a non-planar layer in a thickness direction of the non-planar layer to a thickness of the active pattern to be less than or equal to 7, the size of the non-planar structure in the thickness direction of the non-planar layer is relatively small, making a sidewall of the non-planar structure also relatively small in size, so that a length of a channel of the active pattern on the sidewall of the non-planar structure is relatively small as well. In addition, during crystallization to form the active pattern, it is easier to form a seed crystal at corners adjacent to the sidewall of the non-planar structure. When the seed crystal grows along the sidewall to form a single crystallite, a length of the channel on the sidewall is relatively small, which provides formation conditions for the channel on the sidewall to be composed of the single crystallite. There is no grain boundary in a single crystallite, thereby providing formation conditions for a semiconductor device including a single crystallite channel and having high mobility, thus providing conditions for integrated circuits to be integrated on an insulating substrate.

Figure 2:
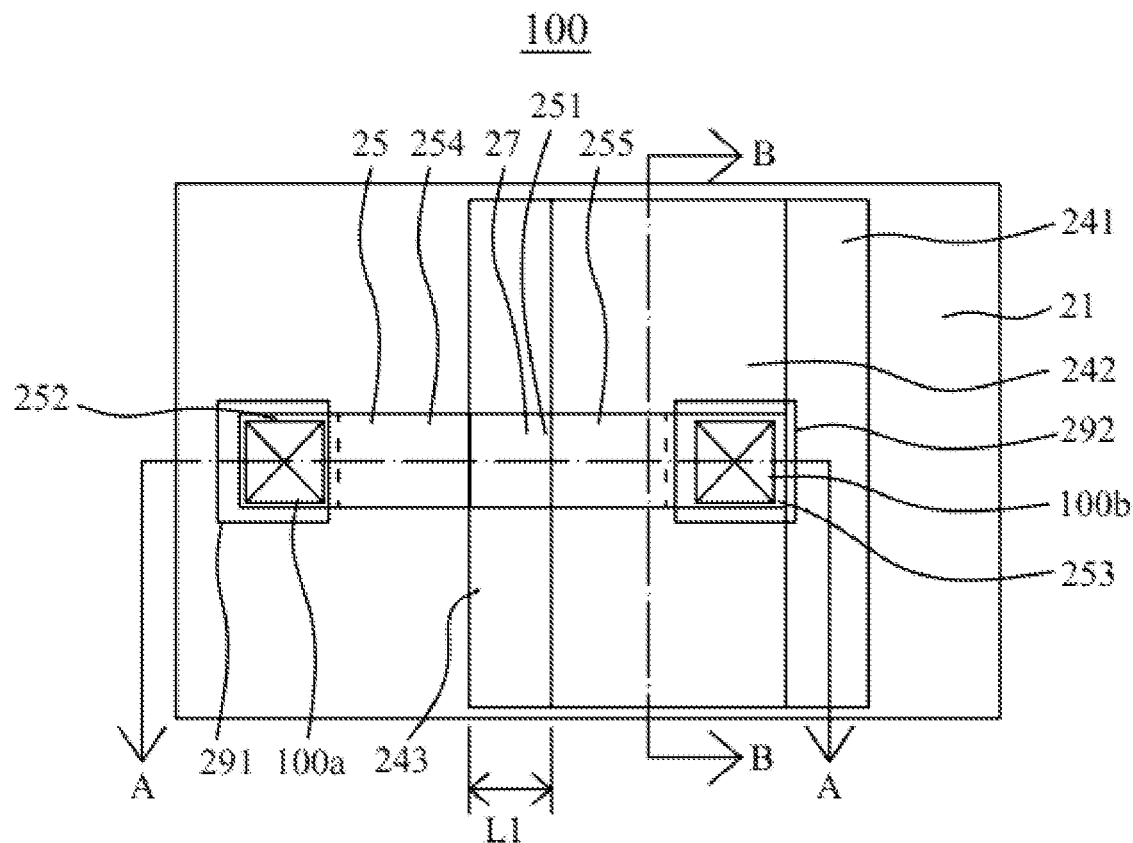
FIG. 2 is a schematic plan view of a semiconductor device according to an embodiment of the present application.
Figure 3:
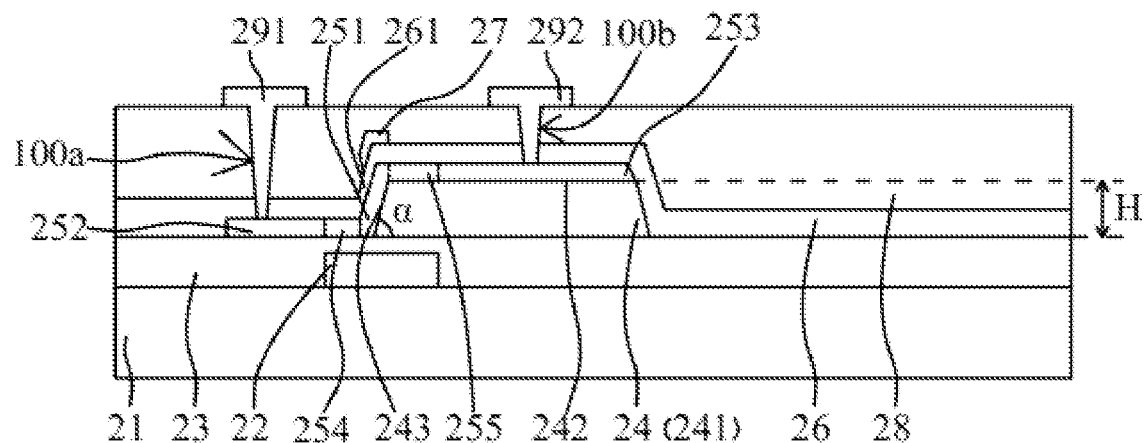
FIG. 3 is a schematic cross-sectional view of the semiconductor device taken along line A-A in FIG. 2.
Figure 4:
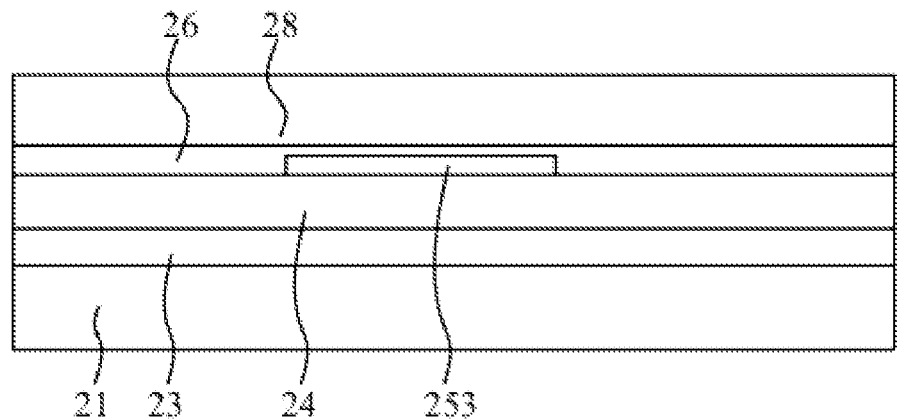
FIG. 4 is a schematic cross-sectional view of the semiconductor device taken along line B-B in FIG. 2.

Referring to FIGS. 2, 3, and 4, FIG. 2 is a schematic plan view of a semiconductor device according to an embodiment of the present application, FIG. 3 is a schematic cross-sectional view of the semiconductor device taken along line A-A in FIG. 2, and FIG. 4 is a schematic cross-sectional view of the semiconductor device taken along line B-B in FIG. 2.

In this embodiment, a semiconductor device 100 is a vertical thin-film transistor. The semiconductor device 100 includes an insulating substrate 21, a light shielding pattern 22, a buffer layer 23, a non-planar layer 24, an active pattern 25, a gate insulating layer 26, a gate 27, an interlayer dielectric layer 28, and source and drain electrodes.

In this embodiment, the insulating substrate 21 is a glass substrate, but it is not limited thereto, and the insulating substrate 21 may also be a flexible substrate.

In this embodiment, the light shielding pattern 22 plays a role of shielding the ambient light incident to the part of the active pattern 25. The light shielding pattern 22 is located on the insulating substrate 21. The light shielding pattern 22 is made of a metal material, and the metal material includes, but is not limited to, at least one of molybdenum, aluminum, titanium, copper, or silver. The light shielding pattern 22 may also be made of a black matrix or the like.

In this embodiment, the buffer layer 23 covers the insulating substrate 21 and the light shielding pattern 22. The buffer layer 23 is made of a material including at least one of silicon nitride or silicon oxide. A thickness of the buffer layer 23 is greater than or equal to 2500 angstroms and less than or equal to 3500 angstroms, for example, 2500 angstroms, 2800 angstroms, 3000 angstroms, 3200 angstroms, or 3500 angstroms.

In this embodiment, the non-planar layer 24 is disposed on the buffer layer 23. The non-planar layer 24 is not coplanar with the buffer layer 23. The non-planar layer 24 includes a non-planar structure 241, which is a convex structure, and all parts of the non-planar layer 24 except the non-planar structure 241 are removed.

The non-planar structure 241 may be at least one of a protruding quadrangular pyramid structure, a convex cube structure, or a convex cuboid structure. The non-planar structure 241 can be formed by one film layer, two film layers, or more than two film layers stacked. The film layers constituting the non-planar structure 241 include an insulating layer, which includes at least one of an inorganic insulating layer or an organic insulating layer. The inorganic insulating layer is made of a material including, but is not limited to, silicon oxide or silicon nitride, and the organic insulating layer is made of a material including, but is not limited to, polyimide, polyacrylate, organic silicon, etc.

The non-planar structure 241 includes at least a sidewall 243 and a top surface 242 connected to the sidewall 243. The sidewall 243 is located on a side of the non-planar structure 241 and is not coplanar with the buffer layer 23. The sidewall 243 of the non-planar structure 241 is a sidewall of a convex structure, and the sidewall 243 overlaps the light shielding pattern 22. The sidewall 243 is at least one of a plane or an arc surface. The arc surface includes a convex arc surface and/or an inward concave arc surface. The top surface 242 is located on a side of the non-planar structure 241 away from the insulating substrate 21.

It should be noted that when the film layer constituting the non-planar structure 241 is an insulating layer, the corresponding sidewall 243 of the non-planar structure 241 includes an insulating sidewall. It is understood that the film comprising the non-planar structure 241 may also include a conductive film.

In this embodiment, the active pattern 25 extends from the buffer layer 23 through the sidewall 243 of the non-planar structure 241 to the top surface 242 of the non-planar structure 241.

The active pattern 25 includes a plurality of crystallites, in other words, a plurality of grain boundaries. Specifically, the active pattern 25 is a low-temperature polysilicon active pattern, but is not limited to this. The active pattern 25 can also be a crystalline metal oxide active pattern.

The active pattern 25 includes a channel 251, and a first contact portion 252 and a second contact portion 253 that are connected to opposite sides of the channel 251. At least part of the channel 251 of the active pattern 25 is located on the sidewall 243, the first contact portion 252 is located on the buffer layer 23, and the second contact portion 253 is located on the top surface 242 of the non-planar structure 241.

Specifically, at least part of the channel 251 of the active pattern 25 is located on the sidewall 243, which means that the entire channel 251 of the active pattern 25 is located on the sidewall 243; alternatively, part of the channel 251 of the active pattern 25 is located on the sidewall 243, and the other part of the channel 251 of the active pattern 25 is located on the buffer layer 23 of the insulating substrate 21; alternatively, part of the channel 251 of the active pattern 25 is located on the sidewall 243, and the other part of the channel 251 of the active pattern 25 is located on the top surface 242 of the non-planar structure 241; alternatively, part of the channel 251 of the active pattern 25 is located on the sidewall 243, and the other part of the channel 251 of the active pattern 25 is located on the buffer layer 23 of the insulating substrate 21 and the top surface 242 of the non-planar structure 241.

It should be noted that in design, the channel 251 is located on the sidewall 243, but due to process deviation, the channel 251 may not be completely located on the sidewall 243.

The active pattern 25 further includes a first lightly doped portion 254 and a second lightly doped portion 255. The first lightly doped portion 254 is connected between the first contact portion 252 and the channel 251, the first lightly doped portion 254 is located on the buffer layer 23, the second lightly doped portion 255 is connected between the second contact portion 253 and the channel 251, and the second lightly doped portion 255 is located on the top surface 242 of the non-planar structure 241.

Orthographic projections of the first lightly doped portion 254, the second lightly doped portion 255, and the channel 251 on the insulating substrate 21 fall within an orthographic projection of the light shielding pattern 22 on the insulating substrate 21. In other words, the light shielding pattern 22 blocks the light incident on the first lightly doped portion 254, the second lightly doped portion 255, and the channel 251.

It should also be noted that the first contact portion 252, the second contact portion 253, the first lightly doped portion 254, and the second lightly doped portion 255 are all doped with ions. A doping concentration of ions in the first contact portion 252 and the second contact portion 253 is greater than that in the first lightly doped portion 254 and the second lightly doped portion 255.

A thickness of the active pattern 25 is greater than or equal to 350 angstroms and less than or equal to 600 angstroms, such as 350 angstroms, 380 angstroms, 400 angstroms, 420 angstroms, 440 angstroms, 460 angstroms, 480 angstroms, 500 angstroms, 520 angstroms, 540 angstroms, 560 angstroms, or 600 angstroms.

In this embodiment, a ratio of a size H of the non-planar structure 241 in a thickness direction of the non-planar layer 24 to a thickness of the active pattern 25 is less than or equal to seven. If the non-planar structure 241 is a convex structure, the ratio of the thickness of the non-planar structure 241 to the thickness of the active pattern 25 is less than or equal to seven. Correspondingly, the thickness of the non-planar structure 241 is less than 4200 angstroms, making a length of the sidewall 243 of the non-planar structure 241 relatively small. In this way, a length L1 of the channel 251 of the active pattern 25 located on the sidewall 243 is less than one micron, which is less than a length of more than two microns of a conventional channel. In addition, during crystallization to form the active pattern 25, it is easier for the active pattern 25 before crystallization to form a seed crystal at a corner between the buffer layer 23 and the sidewall 243. When the seed crystal grows along the sidewall 213 to form a single crystallite, the channel 251 fits on the sidewall 243 has the length L1 less than one micron, which provides formation conditions for the channel 251 on the sidewall 243 to be composed of the single crystallite. There is no grain boundary in a single crystallite, thereby providing formation conditions for a semiconductor device including a single crystallite channel and having high mobility.

In addition, the ratio of the size H of the non-planar structure 241 in the thickness direction of the non-planar layer 24 to the thickness of the active pattern 25 is greater than or equal to two, which ensures that the channel 251 of the active pattern 25 is composed of the single crystallite, and prevents the thickness of the non-planar structure 241 from being too small to cause an excessively short length L1 of the channel 251, thus making the gate insulating layer of the semiconductor device 100 and other structures need to be correspondingly adjusted to be excessively large. In addition, an excessively small thickness of the non-planar structure 241 will affect the thickness uniformity of the non-planar structure 241, thereby affecting the thickness uniformity of the active patterns 25 located on the uneven structure 241.

Specifically, the ratio of the size H of the non-planar structure 241 in the thickness direction of the non-planar layer 24 to the thickness of the active pattern 25 may be greater than or equal to 2.5 and less than or equal to 6, or the ratio of the size H of the non-planar structure 241 in the thickness direction of the non-planar layer 24 to the thickness of the active pattern 25 may be greater than or equal to 3 and less than or equal to 5; alternatively, the ratio of the size H of the non-planar structure 241 in the thickness direction of the non-planar layer 24 to the thickness of the active pattern 25 may be greater than or equal to 3 and less than or equal to 4.

For example, the ratio of the size H of the non-planar structure 241 in the thickness direction of the non-planar layer 24 to the thickness of the active pattern 25 is 2, 2.2, 2.5, 2.8, 3, 3.2, 3.5, 3.8, 4.0, 4.2, 4.4, 4.6, 4.8, 5.0, 5.2, 5.5, 5.8, 6.0, 6.2, 6.5, 6.8, or 7.0.

Specifically, in the thickness direction of the non-planar layer 24, the size H of the non-planar structure 241 may be greater than or equal to 800 angstroms and less than or equal to 3000 angstroms, or greater than or equal to 1200 angstroms and less than or equal to 2700 angstroms, or greater than or equal to 1500 angstroms and less than or equal to 2400 angstroms.

For example, in the thickness direction of the non-planar layer 24, the size H of the non-planar structure 241 is 1000 angstroms, 1200 angstroms, 1400 angstroms, 1600 angstroms, 1800 angstroms, 2000 angstroms, 2200 angstroms, 2400 angstroms, 2600 angstroms, 2800 angstroms, or 3000 angstroms.

In this embodiment, the sidewall 243 is arranged at a first slope angle α with respect to the insulating substrate 21. The first slope angle α is greater than or equal to 45 degrees and less than or equal to 90 degrees, and the ratio of the size H of the non-planar structure 241 in the thickness direction of the non-planar layer 24 to the thickness of the active pattern 25 is greater than or equal to two and less than or equal to seven, so that the length L1 of the channel 251 can be reduced to 0.01 microns to 1 micron, and a width of the channel 251 can be controlled within 0.3 microns to 10 microns. In addition, the configuration that the first slope angle α is greater than or equal to 45 degrees and less than or equal to 90 degrees facilitates formation of seed crystals at the corners between the buffer layer 23 and the sidewall 243 of the non-planar structure 241. A seed crystal grows along the sidewall 243 to fit the channel 251 with a length of 0.01 microns to 1 micrometer, making the channel 251 more easily composed of a single crystallite.

Specifically, the first slope angle α can be greater than or equal to 45 degrees and less than or equal to 90 degrees, or the first slope angle α can be greater than or equal to 50 degrees and less than or equal to 80 degrees, or the first slope angle α can be greater than or equal to 60 degrees and less than or equal to 70 degrees. For example, the first slope angle α may be 50, 55, 60, 65, 70, 75, 80, or 90 degrees.

In this embodiment, by controlling the size of the non-planar structure 241 in the thickness direction of the non-planar layer 24 and the first slope angle α of the sidewall 243, the size of the sidewall 243 is made smaller, and the length L1 of the channel 251 located on the sidewall 243 is 0.01 microns to 1 micron, so that the channel 251 is at least part of a single crystallite. In other words, the channel 251 is the single crystallite, or the channel 251 is part of the single crystallite.

The channel 251 of the active pattern of the semiconductor device 100 in the embodiment of the application is at least part of a single crystallite, so that there is no grain boundary in the channel 251. Therefore, mobility of carriers in the channel 251 is improved, thereby improving mobility of the semiconductor device, which is conducive to achieving integration of an integrated circuit on the insulating substrate, thus reducing the manufacturing cost of the display panel.

In this embodiment, a size of the single crystallite constituting the channel 251 is greater than or equal to 0.25 microns, so as to adapt to a single crystallite size formed by crystallization of amorphous silicon through an excimer laser annealing process. For example, the size of the single crystallite is 0.28 microns, 0.29 microns, 0.30 microns, 0.32 microns, 0.35 microns, 0.36 microns, 0.38 microns, or 0.4 microns.

It should be noted that a current crystallite size of amorphous silicon crystallized by the excimer laser annealing process is small, and a difference value between the current crystallite size and a current channel length of more than 2 microns is also large, which cannot make the channel composed of a single crystallite. In this application, the size of the non-planar structure in the thickness direction of the non-planar layer is controlled in conjunction with the control of the first slope angle of the sidewall to reduce the length of the channel, so that the length of the channel tends to be the same as the size of the single crystallite in current laser annealing processes. In addition, the configuration of the non-planar structure makes it easier to form seed crystals at the corner near the sidewall, providing conditions for the seed crystals to grow along the sidewall to form a single crystallite, which in turn provides formation conditions for a channel with a smaller length on the sidewall composed of a signal crystallite.

It can be understood that in other embodiment, the channel 251 can also include a plurality of crystallites. In other words, the channel 251 includes multiple grain boundaries. After the channel 251 is disposed on the sidewall 243, the length L1 of the channel 251 is reduced to 0.01 microns to 1 micron. When the channel 251 includes multiple crystallites, the grain boundary of the channel 251 is also reduced accordingly, which is conducive to improving the mobility of semiconductor devices, achieving the integration of integrated circuits on glass insulating substrates, and reducing the manufacturing cost of display panels.

In this embodiment, the gate insulating layer 26 covers the active pattern 25, the non-planar structure 241, and the buffer layer 23. The gate insulating layer 26 includes an inclined portion 261, which is inclined relative to the insulating substrate 21. The inclined portion 261 covers the part of the active pattern 25 on the sidewall 243. In other words, the inclined portion 261 is arranged on a portion of the active pattern 25 located on the sidewall 243, and an orthographic projection of the inclined portion 261 on the insulating substrate 21 falls within the orthographic projection of the light shielding pattern 22 on the insulating substrate 21.

A fabrication material of the gate insulating layer 26 is selected from at least one of silicon nitride or silicon oxide. A thickness of the gate insulating layer 26 is greater than or equal to 500 angstroms and less than or equal to 1500 angstroms. For example, the thickness of the gate insulating layer 26 is 600 angstroms, 800 angstroms, 1000 angstroms, 1200 angstroms, 1400 angstroms, or 1500 angstroms.

In this embodiment, the gate 27 is located on a side of the active pattern 25 away from the sidewall 243. A portion of the gate 27 is located on the inclined portion 261 of the gate insulating layer 26, and another portion of the gate 27 is located on a surface of the gate insulating layer 26 above the non-planar structure 241 and away from the non-planar structure 241. It can be understood that the gate 27 may also be located between the non-planar structure 241 and the insulating substrate 21.

An orthographic projection of the gate 27 on the insulating substrate 21 overlaps an orthographic projection of the channel 251 on the insulating substrate 21 to adapt to a process of forming the channel 251, the first lightly doped portion 254, and the second lightly doped portion 255 by doping with the gate 27 as a mask.

Specifically, in this embodiment, as shown in FIG. 2, the orthographic projection of the gate 27 on the insulating substrate 21 and the orthographic projection of the channel 251 on the insulating substrate 21 completely overlap. In other words, an outer contour of the orthographic projection of the gate 27 on the insulating substrate 21 completely coincides with an outer contour of the orthographic projection of the channel 251 on the insulating substrate 21. In addition, an area of the orthographic projection of the gate 27 on the insulating substrate 21 is equal to an area of the orthographic projection of the channel 251 on the insulating substrate 21.

It can be understood that, in other embodiments, the orthographic projection of the channel 251 on the insulating substrate 21 falls within the orthographic projection of the gate 27 on the insulating substrate 21. Correspondingly, the outer contour of the orthographic projection of the gate 27 on the insulating substrate 21 is located at a periphery of the outer contour of the orthographic projection of the channel 251 on the insulating substrate 21. In addition, the area of the orthographic projection of the gate 27 on the insulating substrate 21 is greater than the area of the orthographic projection of the channel 251 on the insulating substrate 21.

Figure 5:
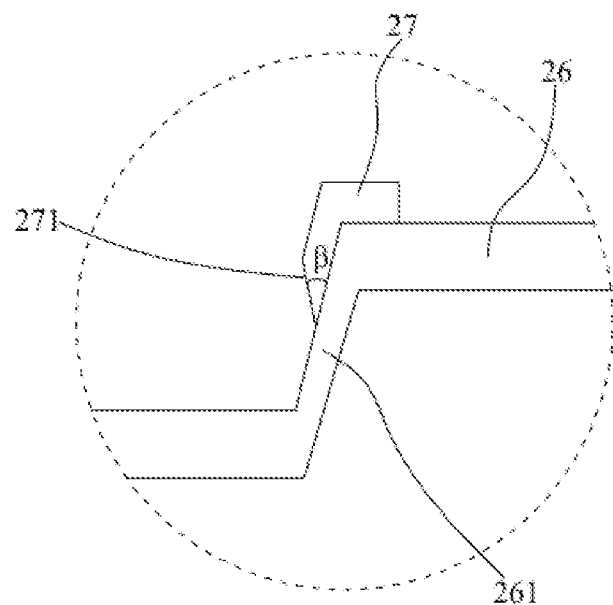
FIG. 5 is a schematic partial enlarged view of an inclined portion of a gate located on a gate insulating layer shown in FIG. 3.

As shown in FIG. 5, FIG. 5 is a schematic partial enlarged view of the inclined portion of the gate located on the gate insulating layer shown in FIG. 3. The gate 27 includes a gate sidewall 271 located on the inclined portion 261, and the gate sidewall 271 is arranged on a side of the gate 27 and is connected to the inclined portion 261. The gate sidewall 271 is disposed at a second slope angle β greater than or equal to 30 degrees and less than or equal to 60 degrees with respect to the inclined portion 261 to adapt to a manufacturing process of the gate 27.

Specifically, the second slope angle β can be greater than or equal to 45 degrees and less than or equal to 55 degrees, or the second slope angle can be greater than or equal to 45 degrees and less than or equal to 50 degrees. For example, the second slope angle β may be 30, 40, 45, 48, 50, 52, 55, 58, or 60 degrees.

The orthographic projection of the gate 27 on the sidewall 243 covers a portion of the orthographic projection of channel 251 on the sidewall 243.

A fabrication material of the gate 27 is selected from at least one of molybdenum, aluminum, titanium, copper, or silver.

In this embodiment, as shown in FIG. 3, the interlayer dielectric layer 28 covers the gate 27 and the gate insulating layer 26. A fabrication material of the interlayer dielectric layer 28 is selected from at least one of silicon nitride or silicon oxide. A thickness of the interlayer dielectric layer 28 is greater than or equal to 5000 angstroms and less than or equal to 6500 angstroms, for example, 5200 angstroms, 5400 angstroms, 5500 angstroms, 5600 angstroms, or 5800 angstroms.

In this embodiment, the source and drain electrodes include a source electrode 291 and a drain electrode 292. The source electrode 291 is in contact with the first contact portion 252 of the active pattern 25 through a first contact hole 100a which extends through the interlayer dielectric layer 28 and the gate insulating layer 26 and is provided corresponding to the first contact portion 252; the drain electrode 292 is in contact with the second contact portion 253 of the active pattern 25 through a second contact hole 100b which extends through the interlayer dielectric layer 28 and the gate insulating layer 26 and is provided corresponding to the second contact portion 253. A fabrication material of the source electrode 291 and the drain electrode 292 is selected from at least one of molybdenum, aluminum, titanium, copper, or silver.

Figure 6:
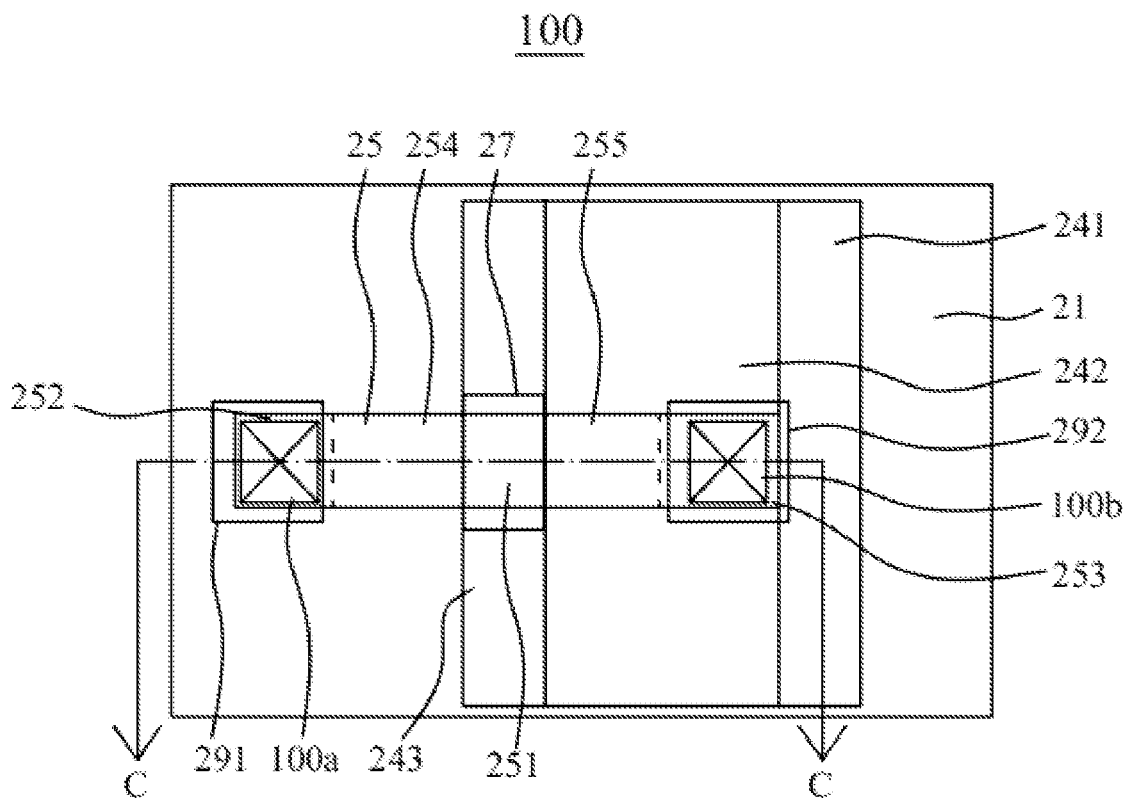
FIG. 6 is a schematic plan view of a semiconductor device according to another embodiment of the present application.
Figure 7:
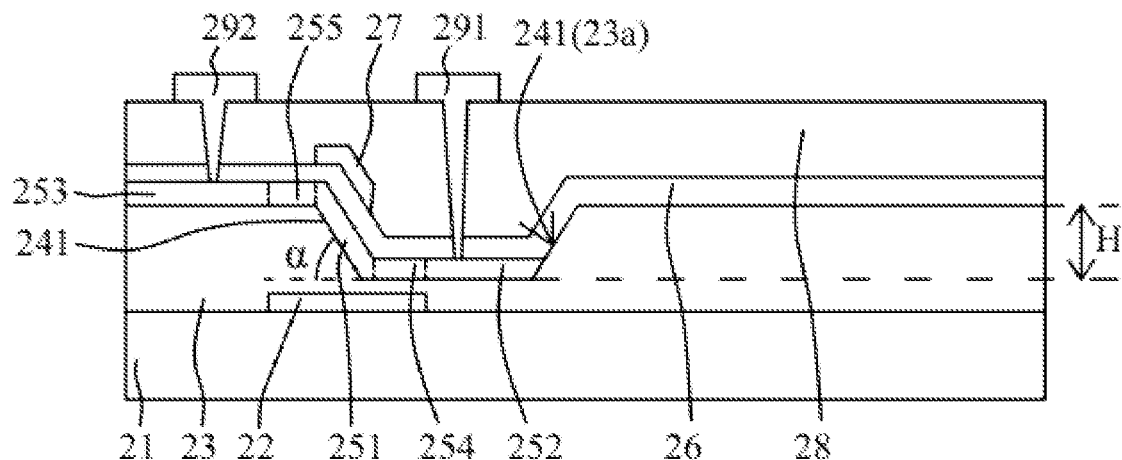
FIG. 7 is a schematic cross-sectional view of the semiconductor device taken along line C-C in FIG. 6.

As shown in FIGS. 6 and 7, FIG. 6 is a schematic plan view of a semiconductor device according to another embodiment of the present application. FIG. 7 is a schematic cross-sectional view of the semiconductor device taken along line C-C in FIG. 6. The semiconductor device of this embodiment is substantially similar to the semiconductor device shown in FIG. 2, the similarities will not be repeated, and the differences are as follows: an orthographic projection of the channel 251 of the semiconductor device 100 shown in FIGS. 6 and 7 on the insulating substrate 21 falls within an orthographic projection of the gate 27 on the insulating substrate 21, a non-planar layer 24 of the semiconductor device shown in FIGS. 6 and 7 is the buffer layer 23, a non-planar structure 241 is located on the buffer layer 23, the non-planar structure 241 is a groove 23a formed on the buffer layer 23, a sidewall 243 of the non-planar structure 241 is a sidewall of the groove 23a, a size H of the non-planar structure 241 in the thickness direction of the non-planar layer 24 is a depth of the groove 23a, and the depth of the groove 23a is less than the thickness of the buffer layer 23. Correspondingly, the size H of the non-planar structure 241 in the thickness direction of the non-planar layer 24 is less than the thickness of the buffer layer 23. In addition, the first lightly doped portion 254 and the first contact portion 252 are located in the groove 23a, the channel 251 is located on one the sidewall of the groove 23a, and the second lightly doped portion 255 and the second contact portion 253 are located on a surface of the buffer layer 23 away from the insulating substrate 21.

The non-planar structure of the semiconductor device in this embodiment of the present application is the groove formed on the buffer layer, which is beneficial to prevent the use of an additional film layer on the semiconductor device for preparation of the non-planar structure, thereby simplifying the process.

The present application further provides a method of manufacturing a semiconductor device, and the method of manufacturing the semiconductor device includes the following steps:

S101: forming a non-planar layer on the insulating substrate, and the non-planar layer includes a non-planar structure having a sidewall.

Figure 8A:
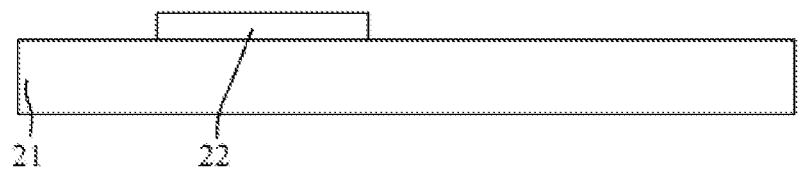
FIGS. 8A to 8J are schematic views showing a process of manufacturing a semiconductor device according to an embodiment of the present application.

Specifically, as shown in FIG. 8A, an insulating substrate 21 is provided to form a light shielding pattern 22 on the insulating substrate 21.

Figure 8B:
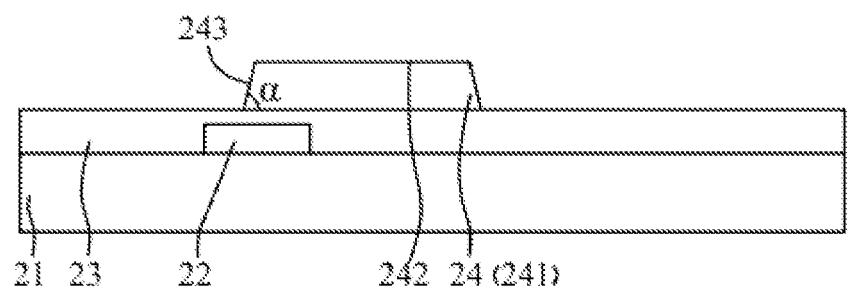

Next, as shown in FIG. 8B, a buffer layer 23 covering the light shielding pattern 22 and the insulating substrate 21 is formed, and a non-planar layer 24 is formed on the buffer layer 23. The non-planar layer 24 includes the non-planar structure 241, which is a convex structure, and all parts except the non-planar structure 241 in the non-planar layer 24 are removed. The non-planar structure 241 has a sidewall 243 and a top surface 242 connected to the sidewall 243. The sidewall 243 is located on a side of the non-planar structure 241 and is arranged at a first slope angle α greater than or equal to 45 degrees and less than or equal to 90 degrees. The top surface 242 is located on a side of the non-planar structure 241 away from the insulating substrate 21.

S102: forming an active pattern at least partially located on the sidewall of the non-planar structure, and forming a gate on a side of the active pattern away from the sidewall.

Figure 8C:
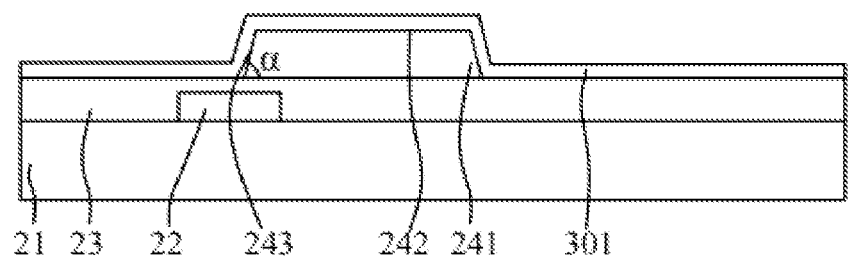

Specifically, as shown in FIG. 8C, an amorphous silicon semiconductor layer 301 is formed on the buffer layer 23 and the non-planar structure 241.

Figure 8D:
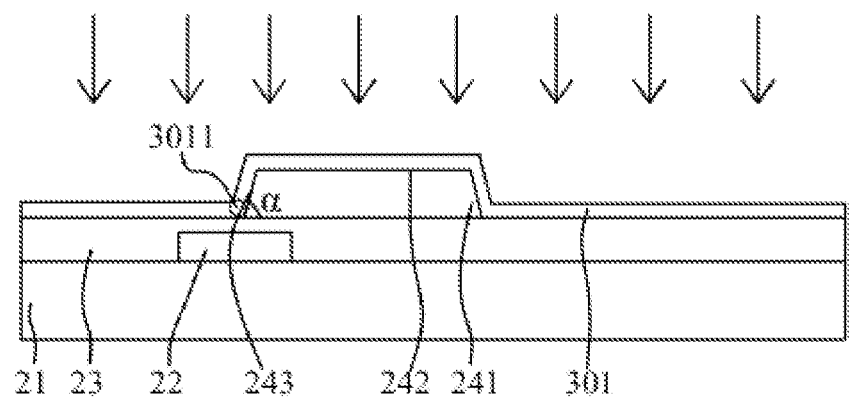
Figure 8E:
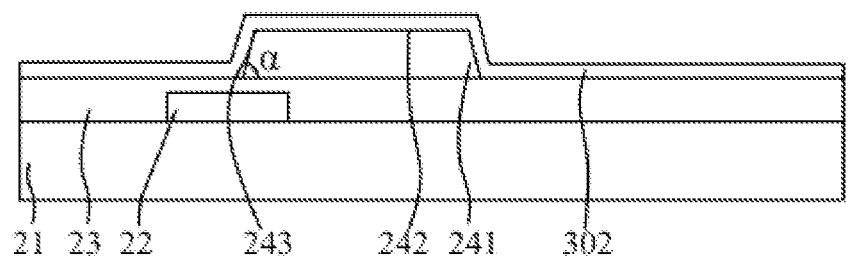

Then, as shown in FIG. 8D, the amorphous silicon semiconductor layer 301 is annealed and crystallized by an excimer laser annealing process. When the amorphous silicon semiconductor layer 301 is annealed and crystallized by the excimer laser annealing process, it is easy to form a seed crystal 3011 at a corner between the buffer layer 23 and the sidewall 243, and the seed crystal 3011 grows into a single crystallite along the sidewall 243. When the sidewall 243 is small in length, the single crystallite can be located on the entire sidewall 243; as shown in FIG. 8E, the amorphous silicon semiconductor layer 301 is processed by the excimer laser annealing process to obtain a low-temperature polysilicon semiconductor layer 302.

Figure 8F:
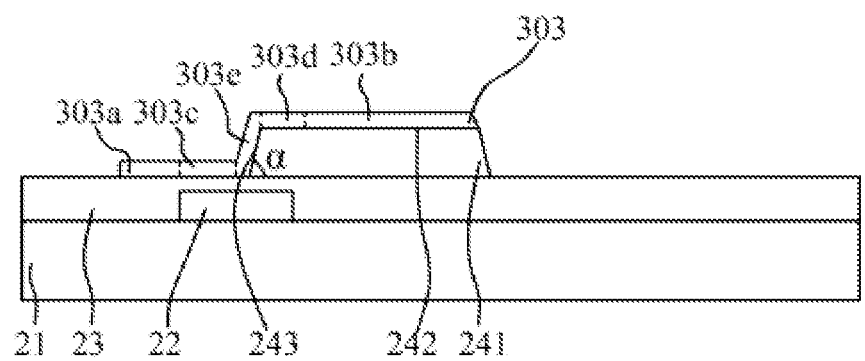

Then, as shown in FIG. 8F, the low-temperature polysilicon semiconductor layer 302 is patterned using a patterning process to obtain a low-temperature polysilicon pattern 303, which extends from the buffer layer 23 through the sidewall 243 of the non-planar structure 241 to the top surface 242 of the non-planar structure 241. The low-temperature polysilicon pattern 303 has a first contact area 303a, a second contact area 303b, a first transition area 303c, a second transition area 303d, and a channel area 303e. At least part of the channel area 303e is located on the sidewall 243. The first contact area 303a and the second contact area 303b are connected to opposite sides of the channel area 303e, respectively. The first transition area 303c is connected between the first contact area 303a and the channel area 303e, and the second transition region 303d is connected between the second contact region 303b and the channel region 303e.

Figure 8G:
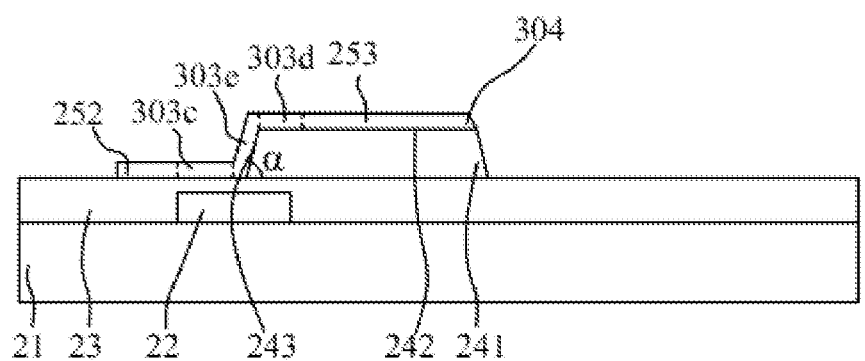

Then, as shown in FIG. 8G, the first contact area 303a and the second contact area 303b of the low-temperature polysilicon pattern 303 are processed by a heavy doping process to obtain a heavily doped low-temperature polysilicon pattern 304. The heavily doped low-temperature polysilicon pattern 304 includes a first contact portion 252 located in the first contact area 303a and a second contact portion 253 located in the second contact area 303b. The first contact portion 252 is located on the buffer layer 23, and the second contact portion 253 is located on the top surface 242 of the non-planar structure 241.

Figure 8H:
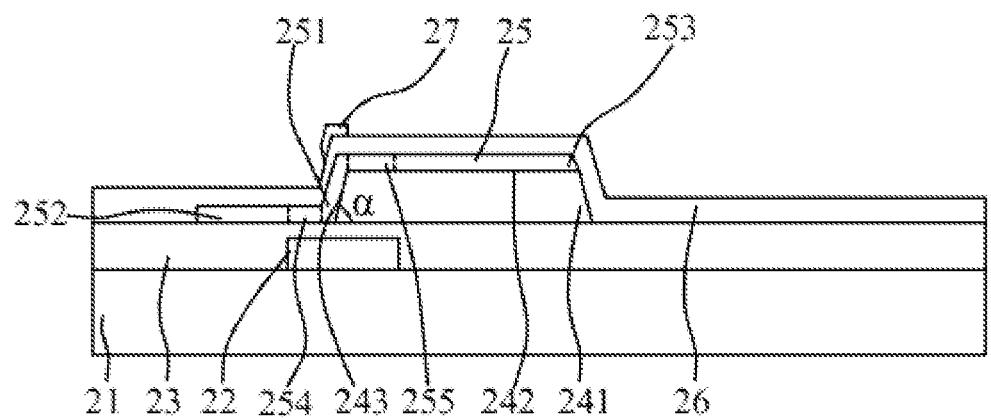

Finally, as shown in FIG. 8H, a gate insulating layer 26 covering the heavily doped low-temperature polysilicon pattern 304 and the buffer layer 23 is formed. A gate 27 is formed on a surface of the gate insulating layer 26 away from the sidewall 243 of the non-planar structure 241. The gate 27 is used as a mask to lightly dope the first transition area 303c and the second transition area 303d of the heavily doped low-temperature polysilicon pattern 304 to obtain an active pattern 25. The active pattern 25 includes a first lightly doped portion 254 located in the first transition region 303c, a second lightly doped portion 255 located in the second transition area 303d, and a channel 251 located in the channel area 303e. The channel 251 is located on the sidewall 243, the first light doping portion 254 is connected between the first contact portion 252 and the channel 251 and is located on the buffer layer 23, and the second lightly doped portion 255 is connected between the second contact portion 253 and the channel 251 and is located on the top surface 242 of the non-planar structure 241.

S103: forming source and drain electrodes in contact with the active pattern.

Figure 8I:
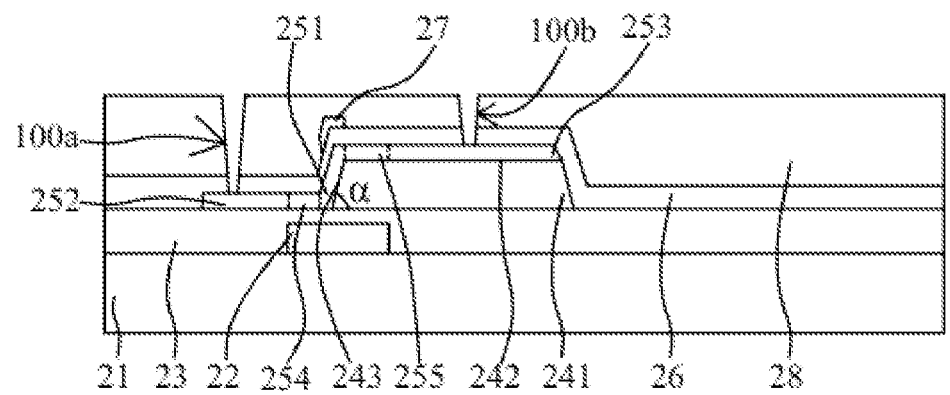
Figure 8J:
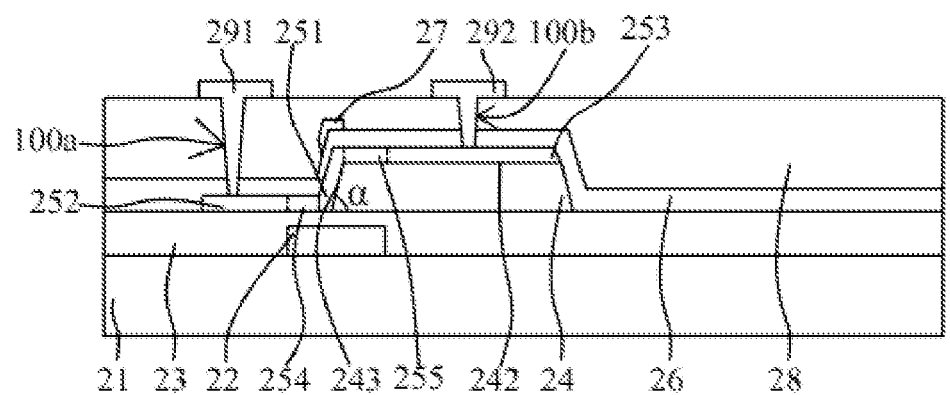

Specifically, as shown in FIG. 8I, an interlayer dielectric layer 28 covering the gate 27 and the gate insulating layer 26 is formed. The interlayer dielectric layer 28 and the gate insulating layer 26 are processed by a patterned process to obtain the first contact hole 100a and the second contact hole 100b, which extend through the interlayer dielectric layer 28 and the gate insulating layer 26. The first contact hole 100a is located corresponding to the first contact portion 252, and the second contact hole 100b is located corresponding to the second contact portion 253; as shown in FIG. 8J, a source electrode 291 is formed on a surface of the interlayer dielectric layer 28 and the first contact hole 100a, and a drain electrode 292 is formed on the surface of the interlayer dielectric layer 28 and the second contact hole 100b. The source electrode 291 contacts the first contact portion 252 through the first contact hole 100a, and the drain electrode 292 contacts the second contact portion 253 through the second contact hole 100b.

In this embodiment, the thickness of the active pattern 25 is greater than or equal to 350 angstroms and less than or equal to 600 angstroms, such as 350 angstroms, 380 angstroms, 400 angstroms, 420 angstroms, 440 angstroms, 460 angstroms, 480 angstroms, 500 angstroms, 520 angstroms, 540 angstroms, 560 angstroms, or 600 angstroms.

In this embodiment, a ratio of a size H of the non-planar structure 241 in a thickness direction of the non-planar layer 24 to a thickness of the active pattern 25 is less than or equal to seven. If the non-planar structure 241 is a convex structure, the ratio of the thickness of the non-planar structure 241 to the thickness of the active pattern 25 is less than or equal to seven. Correspondingly, the thickness of the non-planar structure 241 is less than 4200 angstroms, making a length of the sidewall 243 of the non-planar structure 241 relatively small. Specifically, the length L1 of the channel 251 of the active pattern 25 located on the sidewall 243 is less than one micron, which is less than a length of more than two microns of a conventional channel. In addition, during the annealing and crystallization process of the amorphous silicon semiconductor layer 301, the seed crystal 3011 is easily formed at the corner between the buffer layer 23 and the sidewall 243. When the seed crystal grows along the sidewall 213 to form the single crystallite, the length L1 of the channel 251 fits on the sidewall 243 is less than one micron, which provides formation conditions for the channel 251 on the sidewall 243 to be composed of the single crystallite. There is no grain boundary in a single crystallite, thereby providing formation conditions for a semiconductor device including a single crystallite channel and having high mobility.

In addition, the ratio of the size H of the non-planar structure 241 in the thickness direction of the non-planar layer 24 to the thickness of the active pattern 25 is greater than or equal to two, which ensures that the channel 251 of the active pattern 25 is composed of the single crystallite, and prevents the thickness of the non-planar structure 241 from being too small to cause an excessively short length L1 of the channel 251, thus making the gate insulating layer of the semiconductor device 100 and other structures need to be correspondingly adjusted to be excessively large. In addition, an excessively small thickness of the non-planar structure 241 will affect the thickness uniformity of the non-planar structure 241, thereby affecting the thickness uniformity of the active patterns 25 located on the uneven structure 241.

In this embodiment, the first slope angle α of the sidewall 243 on the insulating substrate 21 is greater than or equal to 45 degrees and less than or equal to 90 degrees. Based on the ratio of the size of the non-planar structure 241 in the thickness direction of the non-planar layer 24 to the thickness of the active pattern 25 is greater than or equal to two and less than or equal to seven, the length of the channel 251 can be reduced to 0.01 microns to 1 micron, and the width of the channel 251 can be controlled to be 0.3 microns to 10 microns. In addition, the configuration that the first slope angle α is greater than or equal to 45 degrees and less than or equal to 90 degrees facilitates formation of seed crystals at the corners between the buffer layer 23 and the sidewall 243 of the non-planar structure 241. A seed crystal grows along the sidewall 243 to fit the channel 251 with a length of 0.01 microns to 1 micrometer, making the channel 251 more easily composed of a single crystallite.

The present application further provides an electronic device, which includes the above-mentioned semiconductor device. The electronic device may include an integrated chip circuit integrated on an insulating substrate. The electronic device can also be a display panel integrated with an integrated chip. The display panel may be any one of a liquid crystal display panel, an organic light-emitting diode display panel, a quantum dot display panel, a micro light-emitting diode display panel, or a sub-millimeter light emitting diode display panel.

The descriptions of the above embodiments are only used to help understand the technical solutions and core ideas of this application; those of ordinary skill in the art should understand that: they can still modify the technical solutions described in the foregoing embodiments, or equivalently replace some of the technical features; and these modifications or replacements do not divorce the essence of the corresponding technical solutions The scope of the technical solution of each embodiment of the present application.

What is claimed is:

1. A semiconductor device, comprising:
   an insulating substrate;
   a non-planar layer disposed on the insulating substrate and comprising a non-planar structure, wherein the non-planar structure comprises a sidewall; and
   an active pattern, wherein at least part of the active pattern is located on the sidewall of the non-planar structure, and the active pattern comprises a channel located on the sidewall;
   a gate located on a side of the active pattern away from the sidewall, wherein an orthographic projection of the gate on the insulating substrate overlaps an orthographic projection of the channel on the insulating substrate;
   a gate insulating layer disposed between the gate and the active pattern, wherein the gate insulating layer comprises an inclined portion, the inclined portion covers a part of the active pattern on the sidewall, and the gate comprises a gate sidewall located on the inclined portion, wherein the gate sidewall is disposed at a slope angle greater than or equal to 30 degrees and less than or equal to 60 degrees with respect to the inclined portion;
   wherein a ratio of a size of the non-planar structure in a thickness direction of the non-planar layer to a thickness of the active pattern is less than or equal to seven.

2. The semiconductor device of claim 1, wherein the ratio of the size of the non-planar structure in the thickness direction of the non-planar layer to the thickness of the active pattern is greater than or equal to two.

3. The semiconductor device of claim 1, wherein the thickness of the active pattern is greater than or equal to 350 angstroms and less than or equal to 600 angstroms.

4. The semiconductor device of claim 1, wherein the sidewall is arranged at a slope angle greater than or equal to 45 degrees and less than or equal to 90 degrees with respect to the insulating substrate.

5. The semiconductor device of claim 1, wherein the channel is at least part of a single crystallite.

6. The semiconductor device of claim 5, wherein a size of the single crystallite is greater than or equal to 0.25 microns.

7. The semiconductor device of claim 1, wherein the channel comprises a plurality of crystallites.

8. The semiconductor device of claim 1, wherein the active pattern comprises a plurality of crystallites.

9. The semiconductor device of claim 1, wherein the active pattern is a low-temperature polysilicon active pattern.

10. The semiconductor device of claim 1, wherein the active pattern further comprises a first contact portion and a second contact portion that are connected to opposite sides of the channel;
    wherein the semiconductor device further comprises:
    an interlayer dielectric layer located on a side of the gate insulating layer away from the insulating substrate and covering the gate and the gate insulating layer;
    a first contact hole extending through the interlayer dielectric layer and the gate insulating layer and arranged corresponding to the first contact portion;
    a second contact hole extending through the interlayer dielectric layer and the gate insulating layer and arranged corresponding to the second contact portion;
    a source electrode disposed in contact with the first contact portion through the first contact hole; and
    a drain electrode disposed in contact with the second contact portion through the second contact hole.

11. The semiconductor device of claim 1, wherein the sidewall comprises an insulating sidewall in contact with the channel.

12. The semiconductor device of claim 1, wherein the non-planar structure comprises a convex structure or a groove structure, and the sidewall is a sidewall included in the convex structure or a sidewall included in the groove structure.

13. An electronic device, comprising a semiconductor device, wherein the semiconductor device comprises:
    an insulating substrate;
    a non-planar layer disposed on the insulating substrate and comprising a non-planar structure, wherein the non-planar structure comprises a sidewall; and
    an active pattern, wherein at least part of the active pattern is located on the sidewall of the non-planar structure, and the active pattern comprises a channel located on the sidewall;
    a gate located on a side of the active pattern away from the sidewall, wherein an orthographic projection of the gate on the insulating substrate overlaps an orthographic projection of the channel on the insulating substrate;
    a gate insulating layer disposed between the gate and the active pattern, wherein the gate insulating layer comprises an inclined portion, the inclined portion covers a part of the active pattern on the sidewall, and the gate comprises a gate sidewall located on the inclined portion, wherein the gate sidewall is disposed at a slope angle greater than or equal to 30 degrees and less than or equal to 60 degrees with respect to the inclined portion;
    wherein a ratio of a size of the non-planar structure in a thickness direction of the non-planar layer to a thickness of the active pattern is less than or equal to seven.

14. The electronic device of claim 13, wherein the sidewall is arranged at a slope angle greater than or equal to 45 degrees and less than or equal to 90 degrees with respect to the insulating substrate.

15. The electronic device of claim 13, wherein the active pattern further comprises a first contact portion and a second contact portion that are connected to opposite sides of the channel;
    wherein the semiconductor device further comprises:
    an interlayer dielectric layer located on a side of the gate insulating layer away from the insulating substrate and covering the gate and the gate insulating layer;
    a first contact hole extending through the interlayer dielectric layer and the gate insulating layer and arranged corresponding to the first contact portion;
    a second contact hole extending through the interlayer dielectric layer and the gate insulating layer and arranged corresponding to the second contact portion;

a source electrode disposed in contact with the first contact portion through the first contact hole; and a drain electrode disposed in contact with the second contact portion through the second contact hole.

16. The electronic device of claim 13, wherein the non-planar structure comprises a convex structure or a groove structure, and the sidewall is a sidewall included in the convex structure or a sidewall included in the groove structure.

17. The semiconductor device of claim 13, wherein the ratio of the size of the non-planar structure in the thickness direction of the non-planar layer to the thickness of the active pattern is greater than or equal to two.

18. The semiconductor device of claim 13, wherein the thickness of the active pattern is greater than or equal to 350 angstroms and less than or equal to 600 angstroms.

19. The semiconductor device of claim 13, wherein the channel is at least part of a single crystallite.

20. The semiconductor device of claim 19, wherein a size of the single crystallite is greater than or equal to 0.25 microns.

\* \* \* \* \*